United States Patent [19]

DeFalco

[11] 4,445,083

[45] Apr. 24, 1984

[54] INTEGRATED CIRCUIT COMPENSATORY REGULATOR APPARATUS

[75] Inventor: John A. DeFalco, Marlboro, Mass.

[73] Assignee: Honeywell Information Systems Inc., Waltham, Mass.

[21] Appl. No.: 296,382

[22] Filed: Aug. 26, 1981

[51] Int. Cl.[3] .......................... G05F 1/56; H01L 27/02

[52] U.S. Cl. .................................... 323/273; 323/269; 357/51; 307/456; 307/303

[58] Field of Search ............... 323/267, 268, 269, 273, 323/274; 307/296 R, 297, 303, 445, 454, 456; 357/40, 46, 51

[56] References Cited

U.S. PATENT DOCUMENTS

| | | | |
|---|---|---|---|
| 3,610,949 | 10/1971 | Armgarth | 307/454 |
| 3,675,114 | 7/1972 | Nercessian | 323/269 |
| 4,139,781 | 2/1979 | Fulkerson | 357/51 X |
| 4,175,250 | 11/1979 | Morgan | 323/273 X |
| 4,287,437 | 9/1981 | Brosch et al. | 307/296 R |
| 4,295,149 | 10/1981 | Balyoz et al. | 357/51 X |
| 4,346,343 | 8/1982 | Berndlmaier et al. | 323/282 |

*Primary Examiner*—Peter S. Wong

*Attorney, Agent, or Firm*—Faith F. Driscoll; Nicholas Prasinos

[57] ABSTRACT

Apparatus adjusts the low supply voltage applied to the bipolar gate array circuits of a semiconductor chip to provide uniform propagation delay in the signals operated on by the array circuits notwithstanding variations in manufacturing tolerances and temperature variations. The apparatus includes a voltage regulator circuit and a first resistor located off the chip connected between its output and adjustment terminals and a second resistor located on the chip connected to the adjustment terminal of the regulator circuit. The voltage regulator circuit in response to changes in the resistance of the second resistor adjusts the low supply voltage at its output terminal so as to provide uniform signal delays through the array circuits.

30 Claims, 4 Drawing Figures

INTEGRATED CIRCUIT COMPENSATORY REGULATOR APPARATUS

BACKGROUND OF THE INVENTION

1. Field of Use

The present invention relates to semiconductor circuits and more particularly to bipolar array circuits including control apparatus therefor.

2. Prior Art

In order to improve the cost performance ratios of LSI computer systems, designers have begun to make more extensive use of gate array technology. A gate array generally consists of a large number of basic circuit elements such as AND/NAND gates or flip-flops. The array is customized by final metallization layers that interconnect the basic circuit elements in the desired fashion. For further information regarding gate array, reference may be made to the article "Customized Metal Layers Vary Standard Gate Chip" by Johoshua Pomeranz, et al. in the Mar. 15, 1979 issue of the publication "Electronics" and in the article "Semicustom Technology Drives Minicomputer Architecture" by David Cane in the December 1980 issue of the publication "Computer Design".

In such array, it has been found that the propagation delays of such gate array circuits can vary so as to affect the performance of the computer system in which they are employed. This can be due to differences occurring during fabrication as well as changes in circuit resistor tolerances occurring during operation.

In general, a variety of techniques have been employed to compensate for variations in process parameters on an LSI chip. Examples of such techniques are disclosed in U.S. Pat. Nos. 3,609,414 and 3,970,875. Since these techniques compensate for variations in threshold gate voltage of field effect transistors (FETS) on an LSI chip, they are not particularly applicable to bipolar circuits and more particularly to gate array circuits.

Accordingly, it is an object of the present invention to provide apparatus for controlling the propogation delay of the basic circuits within a gate array so as to overcome the effects of variations in process parameters.

It is a further object of the present invention to provide apparatus for controlling the operational delays in an gate array so as to be uniform notwithstanding variations in fabrication and environmental conditions.

SUMMARY OF THE INVENTION

The above objects are achieved in a preferred embodiment of the voltage regulator apparatus of the present invention. Such apparatus operates to adjust the low supply voltage applied to bipolar gate array circuits of a semiconductor chip to provide uniform delay in signals operated on by the gate array circuits notwithstanding variations in manufacturing tolerances and temperature variations. The apparatus includes a voltage regulator circuit, a first resistive element located off the chip which connects between the output and adjustment terminals and a second resistive element located on the chip which connects between the adjustment terminal and a reference potential voltage on the chip. The voltage regulator circuit in response to changes in the resistance of the second resistive element adjusts the low supply voltage so as to maintain such uniform signal delays.

In the preferred embodiment, the gate array circuits are constructed from low voltage, low power transistor transistor logic gate circuits, conventional in design. The invention recognizes that propagation delays of such circuits are directly proportional to the resistor values. That is, device capacitances are charged through such resistors which determine charging currents and subsequent propagation delays. When such resistor values increase, propagation delays increase proportionally.

By locating a resistive element on the array chip, the voltage regulator circuit can adjust the low power supply voltage in accordance with changes in the resistance of such resistive element thereby providing a uniform propagation delay. More specifically, when the resistance increases, the low power supply voltage is increased to maintain a predetermined propagation delay. When the resistance decreases the low power supply voltage is decreased to maintain the same predetermined propagation delay. By selecting this resistive element which connects between the output and adjustment voltage regulator terminals to have a fixed minimum tolerance (i.e. change value within a few percent), the low power supply voltage can be set at a value which eliminates most of the first order IC manufacturing tolerances. Also, the values of the two resistive elements are selected to have a predetermined ratio. This enables the voltage regulator circuit to respond only to changes in resistance tolerances.

An additional advantage of the present invention results from connecting the on chip resistive element to the same ground point on the chip as the array logic circuit. Accordingly, the invention automatically compensates for any variation or difference between internal circuit ground and package ground. As a result, propagation delay differences due to internal package ground drops are also minimized.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

DESCRIPTION OF THE PREFERRED EMBODIMENT

Figure 1:
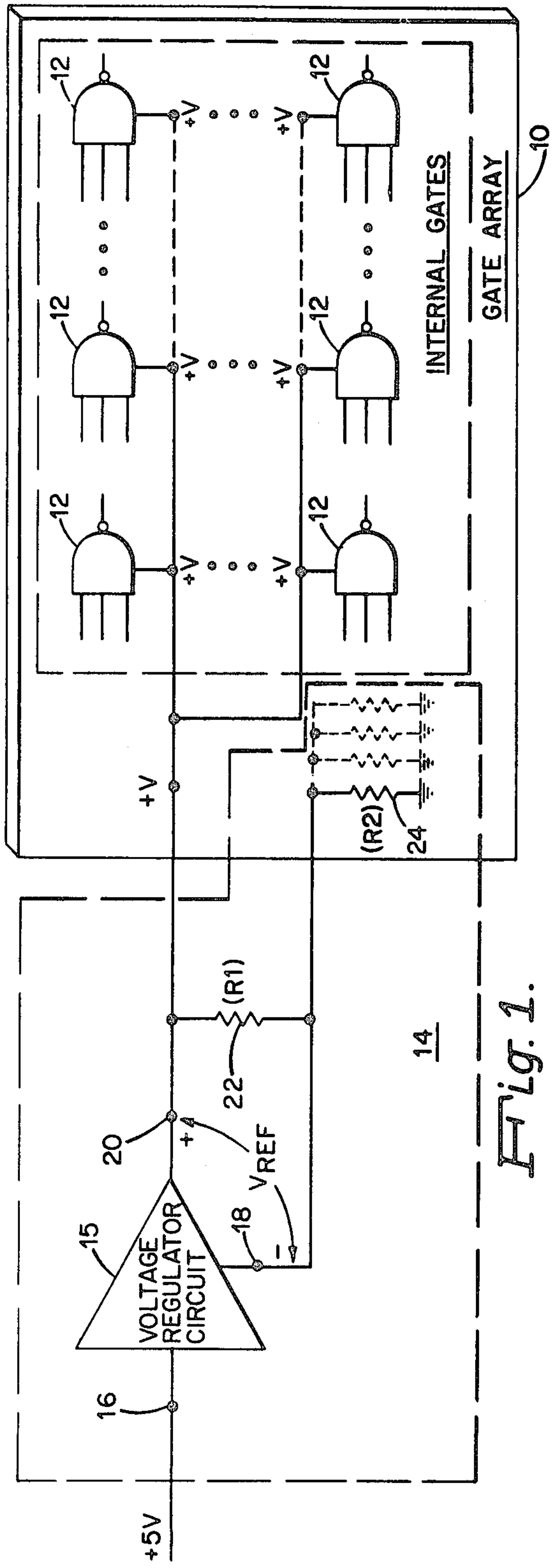
FIG. 1 illustrates a preferred embodiment of the present invention utilized in a semiconductor bipolar gate array chip.

FIG. 1 shows a preferred embodiment of the voltage regulator apparatus 15 of the present invention utilized with a semiconductor chip 10. As shown, the apparatus 14 includes a voltage regulator circuit 15 having an input terminal 16, an adjustment terminal 18 and an output terminal 20. The voltage regulator circuit 15 is constructed using standard integrated circuits such as the three terminal adjustable regulator circuit designated as LM317 manufactured by National Semiconductor Corporation. This circuit is described in greater detail in the publication "Voltage Regulator Handbook" by National Semiconductor Corporation, Copyright 1978.

Briefly, the voltage regulator circuit 15 of the preferred embodiment includes an operational amplifier connected as a unity gain buffer circuit which drives a power Darlington amplifier circuit. A zener diode which provides a 1.2 volt reference voltage is connected between a noninverting input of the operational amplifier circuit and the regulator circuit adjustment terminal. A 50 microamperes current source connects between the noninverting input and the input terminal of the regulator circuit 15. The inverting input of the amplifier circuit connects to the output terminal of the regulator circuit.

Additionally, the apparatus 14 further includes a resistor 22 located off chip 10 which connects between terminals 18 and 22 and a resistor 24 located on chip 10 which connects between terminal 18 and a ground reference potential. The resistors 22 and 24 have resistances values R1 and R2. The values R1 and R2 of the preferred embodiment correspond to 240 and 163 ohms respectively. The value of voltage applied to terminal 16 in the preferred embodiment is +5 volts. This voltage is generated by a conventional power supply which is not shown.

As discussed herein below, in operation, the output voltage +V of the regulator circuit 15 corresponds to the voltage at the adjustment terminal plus 1.2 volts. The 1.2 volts across resistor 22 forces approximately 10 milliamperes of current to flow through resistor 24 increasing the voltage at the adjustment terminal and the output voltage. More specifically, the output voltage +V produced by the circuit 15 is generated in accordance with the following expression:

$$+V = Vref(1+R2/R1)$$

wherein Vref has a nominal value of 1.25 volts.

As seen from the above expression, as the resistance value R2 increases, the output voltage +V increases. As described herein, for proper gate array operation, the increase in voltage +V must be sufficient to just offset the variations in resistance.

The semiconductor chip 10 of FIG. 1 of the preferred embodiment comprises a gate array constructed in a conventional manner utilizing a large number of three input NAND gates 12. Such an array may be constructed in the manner described in the above referenced article "Customized Metal Layers Vary Standard Gate-Array Chip". The specific type of NAND gates 12 is shown in FIG. 2.

Figure 2:
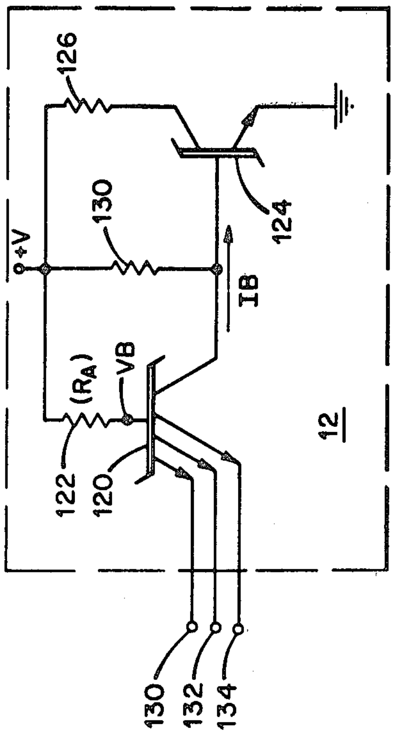
FIG. 2 illustrates in greater detail, the transistor transistor logic gate which is utilized in constructing the chip of FIG. 1.

Referring to FIG. 2, it is seen that each NAND gate 12 is a high speed low power Schottky TTL gate. As shown, the gate 12 includes a multiemitter transistor 120 having a base resistor 122 connected to receive the low power supply voltage +V. Its collector terminal connected to a base terminal of an output transistor 124. The transistor 124 has its collector terminal connected to the supply voltage +V through a resistor 126 and its emitter terminal connected to a ground reference potential. The base terminal of transistor 124 connects through a resistor 130 to supply voltage +V. When the voltage regulator apparatus of the present invention is utilized, the resistor 130 can be omitted.

The NAND gate 12 operates to perform a logical NAND operation upon the signals applied to terminals 130 through 134 and provide the result at the collector of transistor 124. The propagation delay or turn on delay of this circuit is directly proportional to the base current of transistor 124. It has been found that just the initial manufacturing tolerances of the resistors which are used in the construction of the circuit cause the base current to vary from 0.12 milliamperes to 0.20milliamperes. That is, the large tolerances associated with monolithic resistors in the order of ±25 percent when combined with 8.5 percent per 100° C. temperature coefficients produce much variations. Accordingly, the propagation delay varies by this same ratio (i.e. the maximum delay is 67 percent greater than the minimum). Load currents, fanouts, chip power and other parameters all undergo similar variations with resistor tolerances.

The base current IB for transistor 124 is given by the following expression:

$$IB = (+V - VB)/RA \tag{1}$$

wherein VB is the voltage value at the base terminal of transistor 120 and RA is the value of base resistor 122.

The apparatus of the present invention provides the proper change in the voltage supply +V to offset the variations in resistance as follows.

The chip supply voltage +V when increased by an amount ΔV, this change equals the change in resistance value ΔRA times the current IB as shown:

$$\Delta V = \Delta RA\ IB. \tag{2}$$

Substituting the expression (1) for IB into this expression gives the following:

$$\Delta V = \Delta RA(+V - VB)/RA. \tag{3}$$

This expression of ΔV indicates how much the power supply voltage must be changes in order to maintain base current IB at a constant value when RA changes.

The supply voltage +V as indicated above is given by the expression:

$$+V = Vref(1+R2/R1). \tag{4}$$

Taking the derivative of expression (4), results in the following expression:

$$\Delta + V = Vref\Delta R2/R1. \tag{5}$$

It will be noted that ΔR/R represents a resistor tolerance and can be expressed as Rtol=ΔR/R.

$$\text{Accordingly, } \Delta R2 = Rtol\ R2. \tag{6}$$

Substituting the expression (6) for R2 into the above expression for ΔV, results in the following:

$$\Delta V = Vref\ Rtol\ R2/R1. \tag{7}$$

The expression (7) sets forth the desired change in power supply voltage which is provided by the voltage regulator circuit 15 in response to changes in resistance R2 of resistor 24 located on chip 10. The change in voltage required to maintain base current IB constant is established by making expression (7) equal to expression (3) as follows:

$$R\text{tol } V\text{ref } R2/R1 = (+V - VB)R\text{tol}$$

wherein R/RA is replaced by Rtol. This results in the following expression:

$$R2/R1 = (+V - VB)/V\text{ref}. \quad (8)$$

Expression 8 sets forth the desired ratio between resistors 22 and 24 having values R1 and R2 respectively. Assuming that the power supply voltage +V has a value of 2.2 volts, that the base voltage VB has a value of 1.35 volts and the reference voltage Vref has a value of 1.25 volts, the ratio of R2/R1 has a value of 0.68. By maintaining this ratio, the voltage regulator apparatus 14 of the present invention maintains a constant base current value notwithstanding changes in resistance.

As mentioned above, the values of 240 and 163 ohms for resistances R1 and R2 respectively provide the desired value uniform delay. This results in uniform propagation delay through the NAND gates 12 of the bipolar semiconductor gate array chip 10. Since the resistance R1 is held within close tolerances the apparatus 14 responds to slight variations.

Figure 3:
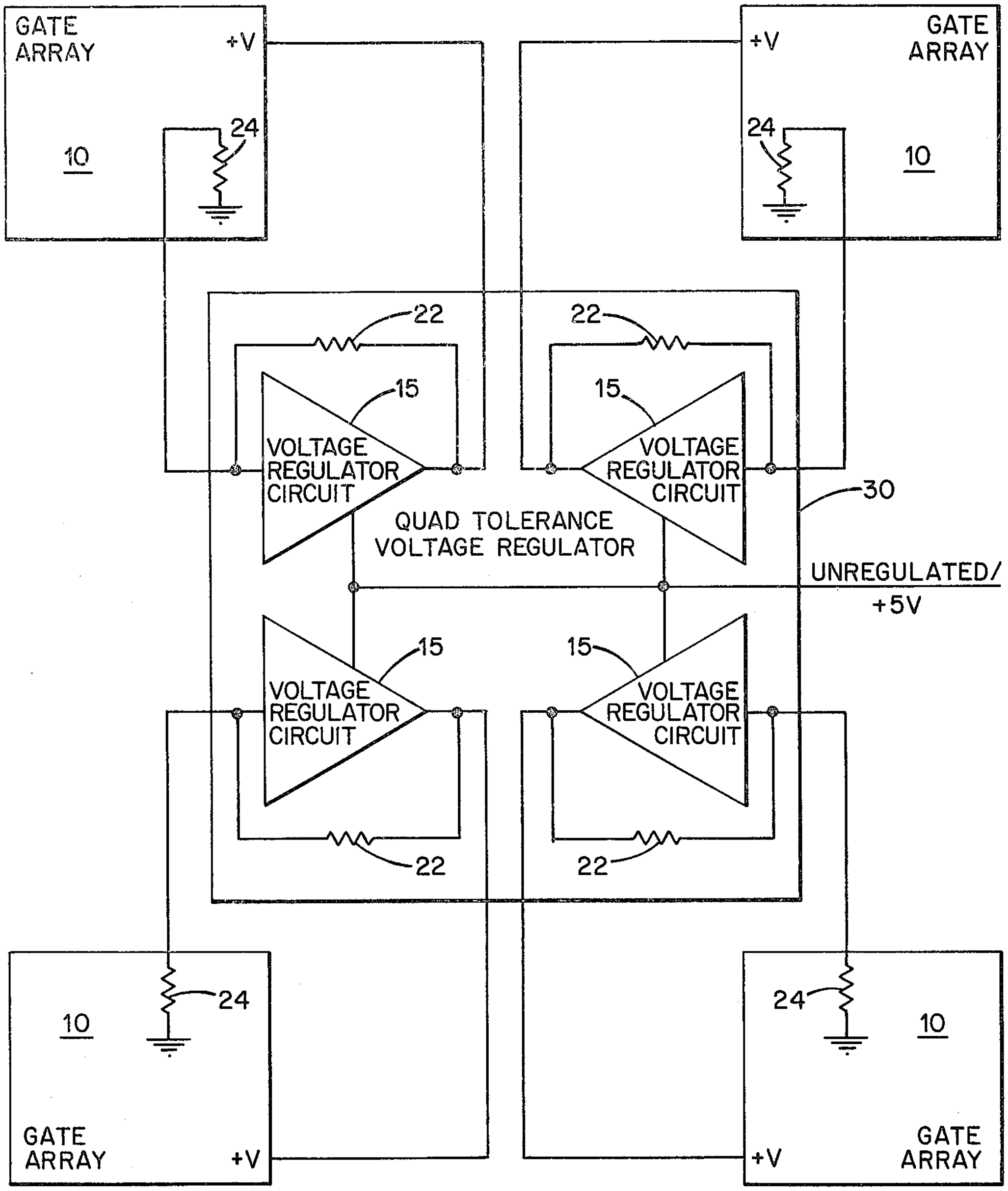
FIG. 3 illustrates a multiport regulator chip embodiment of the present invention.

FIG. 3 shows an embodiment employing the present invention which eliminates the need for having a regulator circuit for each array chip. As shown, a single chip is constructed to have four regulator circuits. This four port regulator chip can be connected as shown to provide independent regulation for four LSI gate array chips.

Figure 4:
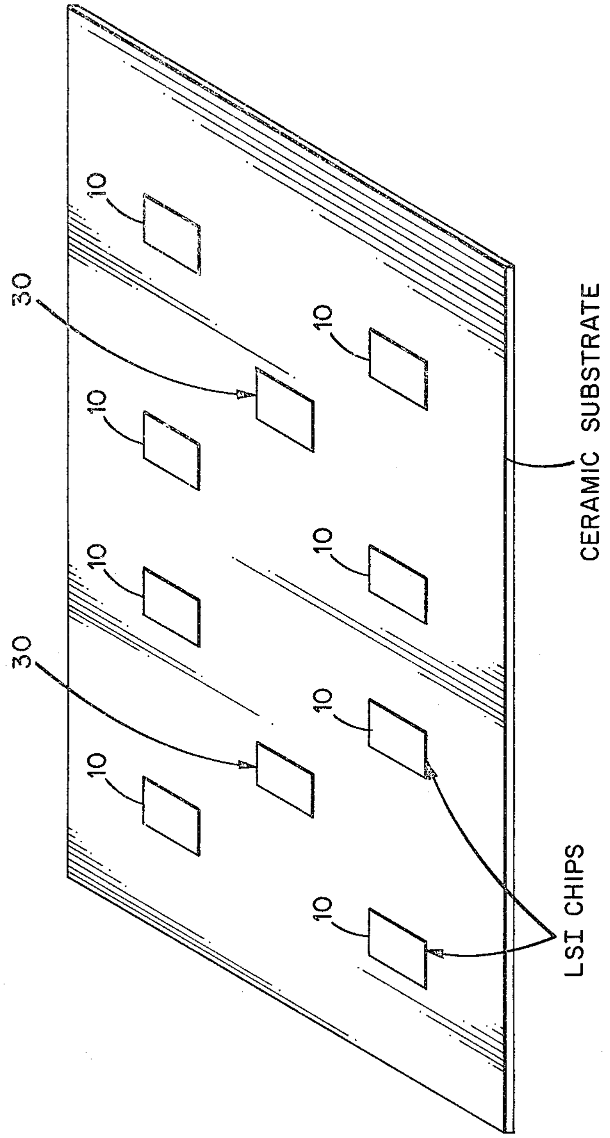
FIG. 4 illustrates a packaging arrangement for the embodiment of FIG. 3.

FIG. 4 shows a packaging arrangement wherein the gate array and associated LSI chip regulator circuits are mounted on a ceramic substrate. Each regulator chip supports four gate arrays as described in FIG. 3. The technique of packaging regulator circuits and gate arrays on ceramic substrate increases the number of gates that can be packaged in a given area and minimizes the extra area that would be taken up by the regulator circuit if arrays and regulator circuits are placed directly on a printed wire board.

In the embodiments of FIGS. 3 and 4, low power supply voltage of 2.2 volts can be derived from a +5 volt power supply. An alternative is to distribute an unregulated or loosely regulated voltage and provide precise regulation and the necessary compensatory tracking in the off chip regulator circuit.

DESCRIPTION OF OPERATION

With reference to FIGS. 1 and 2, the operation of the regulator apparatus of the present invention will now be described. In the preferred embodiment, NAND gate 12 of FIG. 2 is constructed to have a resistance value RA for resistor 122 which equals 4.6 kilohms while the remaining resistors 126 and 130 have values of 8 kilohms. This gate provides a propagation delay time of 2 nanoseconds.

The tolerance for resistor 122 is ±25 percent which means that the maximum and minimum values of base current IB can also vary ±25 percent. The nominal value of base current IB equals V−VB/RA=0.18 milliamperes.

It is assumed that resistance RA changes to a minimum value of 3.45 kilohms. This in turn causes the base current IB to decrease to a value of 0.18 milliamperes causing a decrease in propagation delay time.

When this change in resistance occurs, the same change occurs in the value R2 of chip resistor 24 of FIG. 1. As previously discussed, the output voltage V out=Vref (1+R1/R2). The reference voltage Vref is held at a nominal 1.25 volts by circuit 15. Accordingly, the decrease in resistance R2 produces a corresponding decrease in output voltage. That is, the supply voltage +V is decreased from 2.2 volts to 2.0 volts. This maintains the base current IB at a value of 0.18 milliamperes which in turn holds the propagation time delay of gate 12 at approximately 2 nanoseconds.

In a similar fashion, the circuit 15 operates to maintain the propagation time delay of the gates 12 constant when the resistance RA of resistor 122 increases in value. For example, it is assumed that resistance RA changes to a maximum value of 5.75 kilohms. This results in the base current IB requiring a value of 0.24 milliamperes which would produce a corresponding increase in the propagation delay time of gate 12.

The above change in resistance, is reflected in the value R2 of chip resistor 24 of FIG. 1. As explained above, the increase in resistance R2 produces a corresponding increase in the output voltage of voltage regulator circuit 15. That is, the supply voltage +V is increased from 2.2 volts to 2.4 volts by circuit 15. This maintains the base current IB at a value of 0.18 milliamperes which in turn holds the propagation time delay of gate 12 at 2 nanoseconds.

It will be appreciated that resistor 24 is made subject to the same manufacturing and fabrication techniques that all of the other resistors which are included on chip 12. Therefore, changes in manufacturing tolerances are essentially the same for all resistors. During operation, any changes in gate tolerances are accurately reflected in resistor 24. For exact compensatory effects, the physical design of on chip resistor 24 should be the same as used in the design of gate resistor 122. With certain types of voltage regulators a maximum value of resistor 24 exists due to a small current which flows out of terminal 18 of FIG. 1. Large values of resistor 24 would result in a slight error voltage in the generated +V. In these cases, the physical design of resistor 24 should be accomplished by placing several identical resistors 122 in parallel as shown by the dotted lines in FIG. 1. This will provide optimum tracking by the compensatory apparatus as well as eliminate any error voltages.

The above has shown how the voltage regulator apparatus of the present invention operates to maintain the propagation time delay of a gate array constant. The apparatus of the invention is easily constructed in integrated circuit form. Also, the invention takes advantage of standard regulator circuits and future improvements in such circuits.

Many changes may be made to the preferred embodiment without departing from the teachings of the present invention. For example, it will be appreciated that the regulator circuit 15 and resistor 24 can be included as part of the integrated circuit chip containing the array. Of course, this depends upon the amount of power dissipated by the circuit 15 compared to the potential savings in circuit real estate. However, in either embodiment, resistor 22 is located off the chip so that any tolerance changes are minimized.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. Voltage control apparatus comprising:

a semiconductor chip containing a plurality of bipolar transistor transistor logic circuits arranged to form a gate array, each of said bipolar transistor transistor logic circuits connected to be powered by a low power supply voltage and propagate input signals within a predetermined time period;

voltage regulator circuit means for adjusting the value of an input voltage, said circuit means having an input terminal, an adjustment terminal, and an output terminal, said input terminal being connected to receive said input voltage and said output terminal being connected to apply said low power supply voltage to each of said bipolar transistor logic circuits;

first resistive means being connected between said output and adjustment terminals of said regulator circuit means; and, second resistive means being included on said chip, one end of said second resistive element being connected to a common reference potential of said chip and the other end of said second resistive means being connected to said adjustment terminal, said voltage regulator circuit means being operative in response to changes in the resistance of said second resistive means to adjust said supply voltage so as to maintain said predetermined time period at a constant value.

2. The apparatus of claim 1 wherein said first resistive means has a resistance value R1 and said second resistive means has a resistance value R2, said voltage regulator circuit means adjusting said low power supply voltage in accordance with the following expression:

$$+V=Vref(1+R2/R1)$$

wherein +V corresponds to said low power supply voltage and Vref corresponds to the voltage between said output and adjustment terminals of said voltage regulator circuit means.

3. The apparatus of claim 2 wherein each of said bipolar logic circuits corresponds to a gate circuit including a multiemitter transistor having a base resistor connected to said low power supply voltage and said first and second resistive means having a predetermined ratio which is given by the following expression:

$$R2/R1=(+V-VB)/Vref$$

wherein VB corresponds to the value of base voltage of said multiemitter transistor.

4. The apparatus of claim 3 wherein said predetermined ratio equals 0.68.

5. The apparatus of claim 3 wherein each of said gate circuits is a high speed low power Schottky TTL gate.

6. The apparatus of claim 1 wherein said voltage regulator circuit means is included as an integral part of said semiconductor chip.

7. The apparatus of claim 1 wherein said first resistive means is selected to have a fixed minimum tolerance so as to enable said voltage regulator circuit means to respond to slight changes in said resistance of said second resistive means.

8. The apparatus of claim 1 wherein each of said bipolar logic circuits corresponds to a gate circuit which includes a multiemitter transistor having a base resistor connected directly to said low power supply voltage and wherein said changes in resistances of said second resistive means represents corresponding changes in the current flowing through said base resistor.

9. The apparatus of claim 8 wherein said second resistive means consists of a plurality of parallel resistors located on said chip which are identical in construction to said base resistor for accurately reflecting changes in said multiemitter transistor circuit tolerances using said second resistive means.

10. The apparatus of claim 9 wherein said plurality of parallel resistors are distributed throughout said chip.

11. Voltage control apparatus comprising:

a number of semiconductor chips, each containing a plurality of bipolar transistor transistor logic circuits arranged to form a gate array, each of said bipolar transistor logic circuits connected to be powered by low power supply voltage and provide a predetermined propagation delay for signals applied thereto;

a plurality of voltage regulator circuits corresponding in number to said number of semiconductor chips, each of said plurality of regulator circuits having an input terminal, an output terminal and an adjustment terminal, said input terminal of each regulator circuit being connected to receive an input voltage and said output terminal of each regulator circuit being connected to apply said low power supply voltage to a different one of said number of semiconductor chips;

a plurality of first resistors, each of said first resistors being connected between said output and adjustment terminals of a different one of said plurality of regulator circuits; and, a plurality of second resistors, each of said second resistors being included on a different one of said chips, one end of each second resistor being connected to a common reference potential of said chip and the other end of each said second resistor being connected to the regulator circuit connected to power said chip, each of said voltage regulator circuits being operative in response to any changes in the resistance of said second resistor associated therewith to adjust said low power supply voltage for maintaining a uniform propagation delay of signals through said bipolar logic circuits.

12. The apparatus of claim 11 wherein said input voltage applied to all of said plurality of voltage regulator circuits is unregulated.

13. The apparatus of claim 11 wherein each of said first resistors has a resistance value R1 and each of said second resistors has a resistance value R2, each of said voltage regulator circuits adjusting said low power supply voltage in accordance with the following expression:

$$+V=Vref(1=R2/R1)$$

wherein +V corresponds to said low power supply voltage and Vref corresponds to the voltage between said output and adjustment terminals of said each voltage regulator circuit.

14. The apparatus of claim 3 wherein each of said bipolar logic circuits of each chip corresponds to a gate circuit including a multiemitter transistor having a base resistor connected to said low power supply voltage and said first and second resistors having a predetermined ratio which is given by the following expression:

$$R1/R2=(+V-VB)/Vref$$

wherein VB corresponds to the value of base voltage of said multiemitter transistor.

15. The apparatus of claim 14 wherein said predetermined ratio equals 0.68.

16. The apparatus of claim 11 wherein each said voltage regulator circuit is included as an integral part of said semiconductor chip powered by said voltage regulator circuit.

17. The apparatus of claim 11 wherein each of said first resistors is selected to have a fixed minimum tolerance so as to enable said voltage regulator circuit connected therewith to respond to slight changes in said resistance of said second resistor connected therewith.

18. The apparatus of claim 11 wherein each of said bipolar logic circuits of each chip corresponds to a gate circuit which includes a multiemitter transistor having a base resistor connected directly to said low power supply voltage and wherein said changes in resistances of said second resistor located on said chip represents corresponding changes in the current flowing through said base resistor.

19. The apparatus of claim 18 wherein each of said second resistors consists of a plurality of parallel resistors located on said chip which are identical in construction to said base resistor for accurately reflecting changes in said multiemitter transistor circuit tolerances in said second resistor.

20. The apparatus of claim 11 wherein each of said plurality of voltage regulator circuits are mounted on a common substrate.

21. The apparatus of claim 11 wherein each of said plurality of voltage regulator circuits and said semiconductor chip are mounted on a common substrate.

22. Voltage control apparatus comprising:

a semiconductor chip including:

a plurality of bipolar transistor transistor logic circuits connected as a gate array, each of said bipolar logic circuits connected to be powered by a low power supply voltage and connected to receive input signals upon which a predetermined logical operation will be performed and the result provided after a predetermined propagation delay; and a first resistive element having one end connected to a common reference potential of said chip;

a second resistive element located off said chip, conductor means for connecting one end of said second resistive element to the other end of said first resistive element forming a common junction; and, a voltage regulator circuit having an input terminal, an adjustment terminal and an output terminal, said input terminal being connected to receive an input voltage, said adjustment terminal being connected to said common junction and said output terminal being connected to apply said low power supply voltage to each of said bipolar transistor logic circuits, said voltage regulator circuit being operative to adjust said low power supply voltage in accordance with changes in the resistance of said first resistive element so as to maintain said predetermined propagation delay through said array uniform.

23. The apparatus of claim 22 wherein said second resistive element has a resistance value R1 and said first resistive element has a resistance value R2, said voltage regulator circuit adjusting said low power supply voltage in accordance with the following expression:

$$+V=Vref(1+R2/R1)$$

wherein +V corresponds to said low power supply voltage and Vref corresponds to the voltage between said output and adjustment terminals of said voltage regulator circuit.

24. The apparatus of claim 23 wherein each of said bipolar logic circuits corresponds to a gate circuit including a multiemitter transistor having a base resistor connected to said low power supply voltage and said first and second resistive elements having a predetermined ratio which is given by the following expression:

$$R2/R1=(+V-VB)/Vref$$

wherein VB corresponds to the value of base voltage of said multiemitter transistor.

25. The apparatus of claim 24 wherein said predetermined ratio equals 0.68.

26. The apparatus of claim 24 wherein said voltage regulator circuit is included as an integral part of said semiconductor chip.

27. The apparatus of claim 24 wherein said second resistive element is selected to have a fixed minimum tolerance so as to enable said voltage regulator circuit to respond to slight changes in said resistance of said first resistive element.

28. The apparatus of claim 22 wherein each of said bipolar logic circuits corresponds to a gate circuit which includes a multiemitter transistor having a base resistor connected directly to said low power supply voltage and wherein said changes in resistances of said first resistive element represents corresponding changes in the current flowing through said base resistor.

29. The apparatus of claim 28 wherein said first resistive element consists of a plurality of parallel resistors located on said chip which are identical in construction to said base resistor for accurately reflecting changes in said multiemitter transistor circuit tolerances using said first resistive element.

30. The apparatus of claim 29 wherein said plurality of parallel resistors are distributed throughout said chip.

* * * * *